(12) United States Patent
Nakatsugawa

(10) Patent No.: US 9,255,997 B2
(45) Date of Patent: Feb. 9, 2016

(54) RADIOLOGICAL IMAGE DETECTION APPARATUS

(75) Inventor: Haruyasu Nakatsugawa, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 572 days.

(21) Appl. No.: 13/563,308

(22) Filed: Jul. 31, 2012

(65) Prior Publication Data

US 2013/0048864 A1 Feb. 28, 2013

(30) Foreign Application Priority Data

Aug. 30, 2011 (JP) .................. 2011-188048

(51) Int. Cl.
  *G01T 1/20* (2006.01)
  *H01L 27/146* (2006.01)
(52) U.S. Cl.
  CPC ........ *G01T 1/2018* (2013.01); *H01L 27/14618* (2013.01); *H01L 27/14663* (2013.01); *H01L 2924/0002* (2013.01); *Y10T 156/10* (2015.01)
(58) Field of Classification Search
  CPC ........ G01T 1/20; G01T 1/2002; G01T 1/2018
  USPC ............. 250/361 R, 370.09, 370.11
  See application file for complete search history.

(56) References Cited

U.S. PATENT DOCUMENTS

| 8,779,372 | B2 * | 7/2014 | Inoue et al. ............ 250/370.11 |
| 8,803,101 | B2 * | 8/2014 | Kaneko et al. .......... 250/370.11 |
| 2004/0016886 | A1 * | 1/2004 | Ringermacher et al. . 250/370.11 |
| 2004/0113088 | A1 * | 6/2004 | Brabec et al. ............ 250/370.11 |
| 2004/0238750 | A1 * | 12/2004 | Vafi et al. ................ 250/370.11 |
| 2008/0054183 | A1 | 3/2008 | Nagata et al. |
| 2008/0206917 | A1 * | 8/2008 | Dast ................................ 438/65 |

(Continued)

FOREIGN PATENT DOCUMENTS

| JP | H05-011301 U | 2/1993 |
| JP | 2004-064087 A | 2/2004 |

(Continued)

OTHER PUBLICATIONS

Office Action issued by the Japanese Patent Office on Oct. 14, 2014 in connection with Japanese Patent Application No. 2011-188048.

(Continued)

*Primary Examiner* — Casey Bryant
(74) *Attorney, Agent, or Firm* — Jean C. Edwards, Esq.; Edwards Neils PLLC

(57) ABSTRACT

A radiological image detection apparatus includes a radiological image conversion panel and a sensor panel. A sealant that is disposed between a substrate of the radiological image conversion panel and a substrate of the sensor panel and surrounds a scintillator in the radiological image conversion panel and a pixel array in the sensor panel to form an isolated space on the inside of the sealant. The scintillator includes a columnar portion including a group of columnar crystals formed by growing crystals of the phosphor in columnar shapes and a surface configured by a set of tips of the columnar crystals is disposed in close contact with the pixel array without being bonded to the pixel array. Both of the substrate of the radiological image conversion panel and the substrate of the sensor panel are flexible, and the isolated space is depressurized.

12 Claims, 12 Drawing Sheets

(56) References Cited

U.S. PATENT DOCUMENTS

| | | | |
|---|---|---|---|
| 2008/0290285 A1* | 11/2008 | Wakamatsu | 250/370.11 |
| 2010/0243908 A1* | 9/2010 | Shoji et al. | 250/370.11 |
| 2011/0006213 A1* | 1/2011 | Sato et al. | 250/367 |
| 2011/0158390 A1 | 6/2011 | Ohta et al. | |
| 2011/0315887 A1* | 12/2011 | Inoue et al. | 250/369 |

FOREIGN PATENT DOCUMENTS

| | | |
|---|---|---|
| JP | 2006-337184 A | 12/2006 |
| JP | 2010-261720 A | 11/2010 |
| JP | 2011-017683 A | 1/2011 |
| JP | 2011-033562 A | 2/2011 |
| JP | 2011-133860 A | 7/2011 |
| JP | 2011-137804 A | 7/2011 |
| WO | WO 01-51951 A1 | 7/2001 |
| WO | WO 2008-029610 A1 | 3/2008 |
| WO | 2010/029779 A1 | 3/2010 |

OTHER PUBLICATIONS

Notification of First Office Action issued by the State Intellectual Property Office (SIPO) of China on Dec. 4, 2015 in connection with Chinese Patent Application No. 201210270230.0.

* cited by examiner

RADIOLOGICAL IMAGE DETECTION APPARATUS

CROSS-REFERENCE TO RELATED APPLICATION

This application claims the benefit of Japanese Patent Application No. 2011-188048, filed on Aug. 30, 2011, the entire contents of which are hereby incorporated by reference.

BACKGROUND OF THE INVENTION

1. Technical Field

The present invention relates to a radiological image detection apparatus.

2. Background Art

Recently, a radiological image detection apparatus that utilizes a flat panel detector (FPD) for detecting a radiological image to generate digital image data has been put into practical use. The radiological image detection apparatus has been rapidly distributed because an image can be instantly confirmed as compared with an imaging plate configured by a photostimulable phosphor (accumulative phosphor). Various types of radiological image detection apparatus are available, one of which is known as an indirect conversion type.

The indirect conversion type radiological image detection apparatus includes a scintillator for generating fluorescence when exposed to radiation and a pixel array for detecting the fluorescence of the scintillator. The scintillator and the pixel array are disposed on, for example, individual substrates, respectively, and are bonded to each other through an adhesive layer. The radiation is converted into light by the scintillator and the fluorescence of the scintillator is converted into an electrical signal by the pixel array, and, as a result, digital image data is generated (see, for example, JP-A-2011-017683 corresponding to US 2011/006213 A1, and JP-A-2011-033562).

The scintillator is typically formed by a vapor deposition method using an alkali halide phosphor such as cesium iodide (CsI), and sodium iodide (NaI), and is configured by a group of columnar crystals formed by growing crystals of the phosphor into columnar shapes. The columnar crystals of the phosphor formed by the vapor deposition method do not contain impurities such as a binder, and also suppresses a diffusion of fluorescence by a light guide effect that guides the fluorescence generated in a columnar crystal in a growth direction of the crystal. Therefore, sensitivity of the radiological image detection apparatus and sharpness of an image can be improved.

A radiological image detection apparatus in which the scintillator and the pixel array are in close contact with each other without using the adhesive layer has also been known (see, for example, JP-A-2010-261720). In the radiological image detection apparatus disclosed in JP-A-2010-261720, a substrate for supporting the scintillator is flexible, and the scintillator and the pixel array is placed and an isolated space is also disposed between a substrate for supporting the scintillator and a substrate for supporting the pixel array. As the isolated space is depressurized, the substrate for supporting the scintillator is warped, and the scintillator is pressed by the pixel array. Therefore, the non-uniformity of image quality caused by the non-uniformity of the thickness of the adhesive layer is reduced.

SUMMARY

In a scintillator formed by a group of columnar crystals, the lengths of the columnar crystals may vary locally. In this case, in the radiological image detection apparatus described in JP-A-2010-261720, the local variation of the lengths of the columnar crystals may not be absorbed only by the warpage of the substrate for supporting the scintillator, and a gap may be generated locally between the scintillator and the pixel array. The gap causes the diffusion of fluorescence generated from the scintillator, which may locally degrade the sharpness of an image.

The present invention has been made in consideration of the above-mentioned matters, and it is an object of the present invention to provide a radiological image detection apparatus which has an excellent uniformity of image quality.

According to an aspect of the present invention, there is provided a radiological image detection apparatus including: a radiological image conversion panel that includes a scintillator including a phosphor that generates fluorescence upon exposure to radiation, and a substrate supporting the scintillator; a sensor panel that includes a pixel array disposed in close contact with the scintillator and detecting the fluorescence generated from the scintillator, and a substrate supporting the pixel array; and a sealant that is disposed between the substrate of the radiological image conversion panel and the substrate of the sensor panel and surrounds the scintillator and the pixel array to form an isolated space on the inside of the sealant. The scintillator includes a columnar portion including a group of columnar crystals formed by growing crystals of the phosphor in columnar shapes. A surface configured by a set of tips of the columnar crystals is disposed in close contact with the pixel array without being bonded to the pixel array. Both of the substrate of the radiological image conversion panel and the substrate of the sensor panel are flexible. The isolated space is depressurized.

According to an aspect of the present invention, a scintillator and a pixel array are placed in a space formed by a first substrate for supporting the scintillator, a second substrate for supporting the pixel array, and a sealant, and the space is depressurized, such that the scintillator comes into close contact with the pixel array without being bonded to the pixel array. By forming both of the first substrate and the second substrate to be flexible, the scintillator and the pixel array may come into close contact with each other in its entirety without any gap. Therefore, the uniformity of the image quality can be improved.

Since the scintillator and the pixel array are not bonded to each other, the radiological image conversion panel and the sensor panel can be easily separated from each other. Therefore, when one of the radiological image conversion panel and the sensor panel is damaged, only the damaged panel can be replaced to recycle the panels as a radiological image detection apparatus.

DETAILED DESCRIPTION OF EMBODIMENTS OF THE INVENTION

Figure 1:
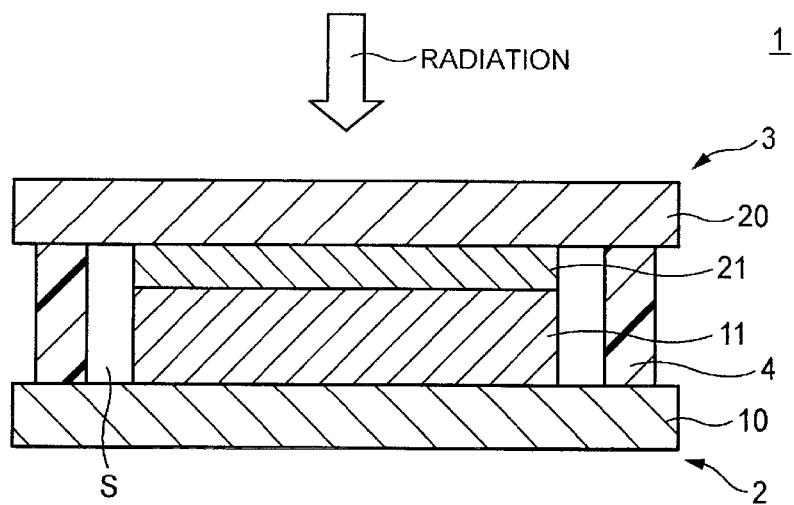
FIG. 1 is a diagram schematically illustrating a configuration of a radiological image detection apparatus according to an exemplary embodiment of the present invention.

FIG. 1 illustrates a configuration of a radiological image detection apparatus according to an exemplary embodiment of the present invention.

A radiological image detection apparatus 1 illustrated in FIG. 1 includes a radiological image conversion panel 2 and a sensor panel 3.

The radiological image conversion panel 2 includes a flexible support substrate 10 and a scintillator 11 which is formed of a phosphor for generating fluorescence upon exposure to radiation. The scintillator 11 is disposed on the support substrate 10.

The sensor panel 3 includes a flexible insulating substrate 20 and a pixel array 21 disposed on the insulating substrate 20. Each of the pixels of the pixel array 21 detects the fluorescence generated from the scintillator 11.

The radiological image conversion panel 2 and the sensor panel 3 are arranged such that the scintillator 11 and the pixel array 21 are disposed facing to each other, and are bonded by a sealant 4.

The sealant 4 is disposed between the support substrate 10 of the radiological image conversion panel 2 and the insulating substrate 20 of the sensor panel 3 to surround the scintillator 11 and the pixel array 21, and an isolated space S is formed on the inside of the sealant.

The space S is in a depressurized state as compared to the outside thereof. The scintillator 11 is in close contact with the pixel array 21 without being bonded due to the deformation of the support substrate 10 and the insulating substrate 20.

The radiological image detection apparatus 1 is a so-called irradiation side sampling (ISS) type radiological image detection apparatus, in which the sensor panel 3 and the radiological image conversion panel 2 are arranged in this order from a radiation incident side. The radiation penetrates the insulating substrate 20 and the pixel array 21 of the sensor panel 3 to be incident to the scintillator 11 of the radiation image conversion panel 2. The radiation incident side of the scintillator 11, which considerably generates fluorescence, is disposed adjacent to the pixel array 21, thereby improving sensitivity.

Figure 2:
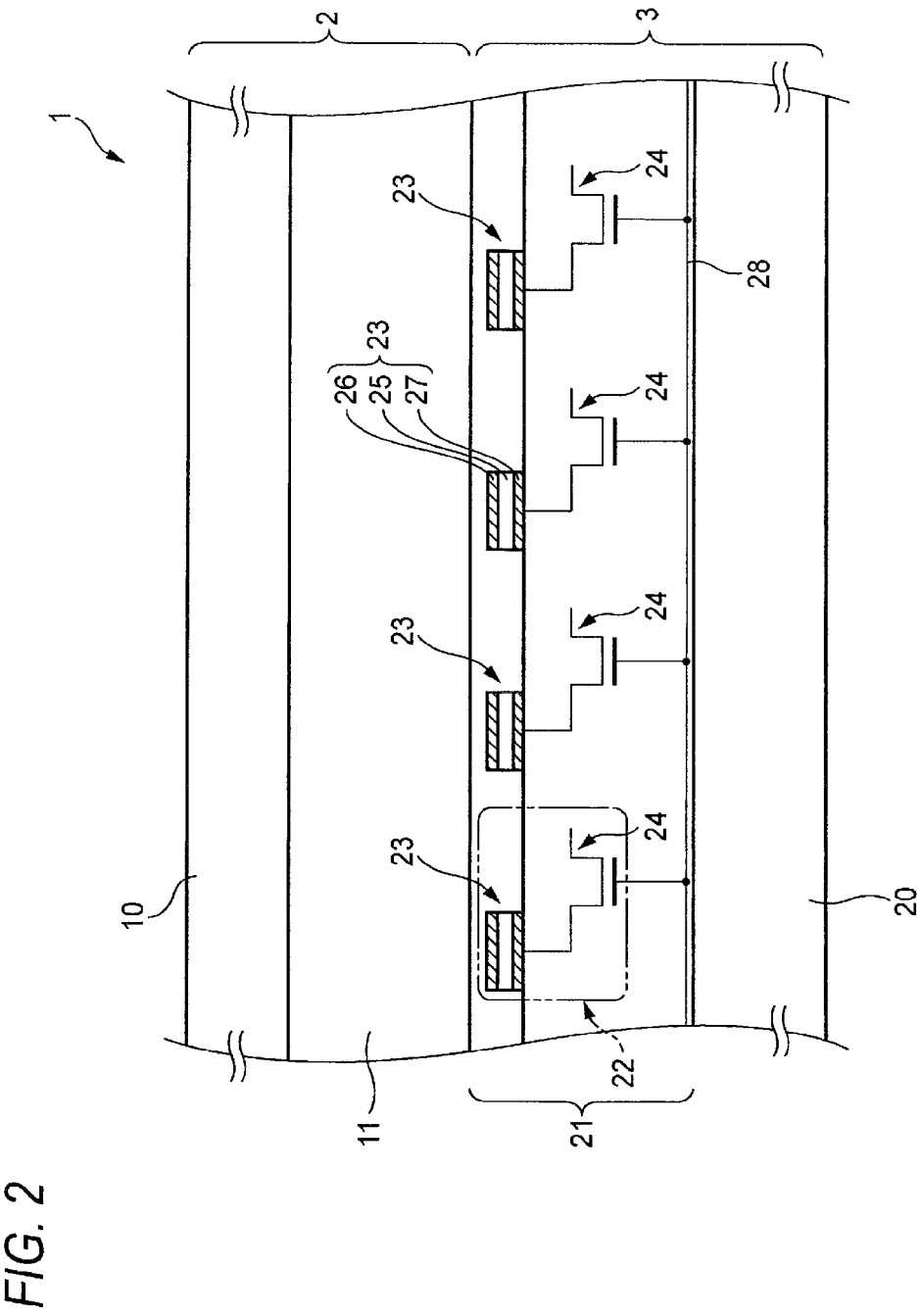
FIG. 2 is a diagram schematically illustrating a configuration of a sensor panel of the radiological image detection apparatus of FIG. 1.
Figure 3:
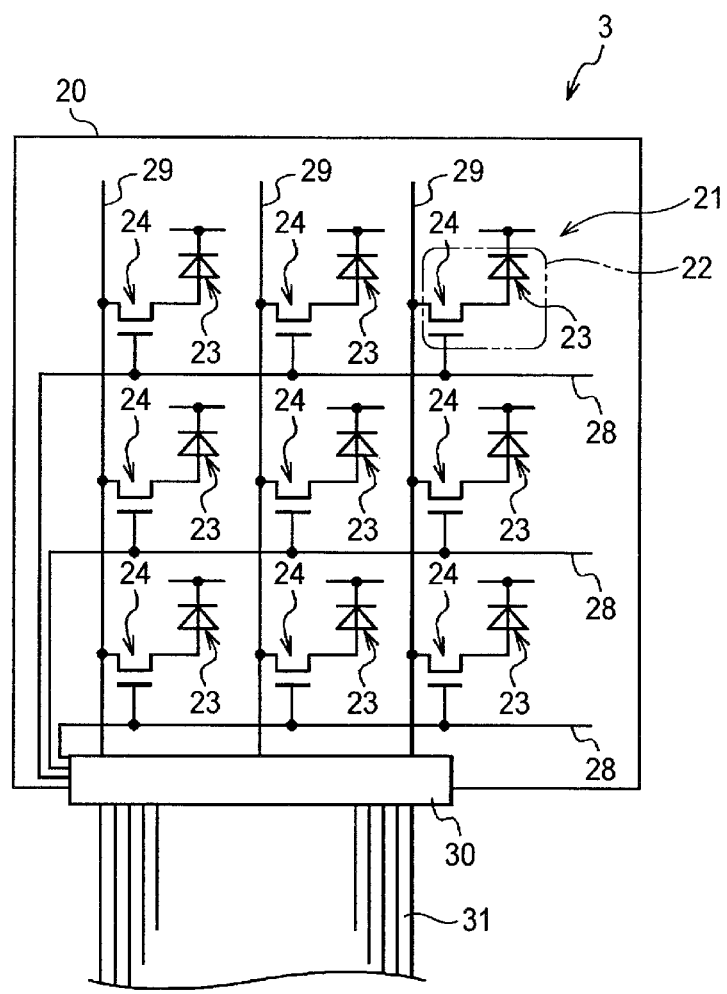
FIG. 3 is a diagram schematically illustrating a configuration of the sensor panel of the radiological image detection apparatus of FIG. 1.

FIGS. 2 and 3 illustrate the configuration of the sensor panel 3.

The pixel array 21 is formed by arranging a plurality of pixels 22 on the insulating substrate 20 in a two-dimensional form, and each of the pixels 22 is constituted by a photoelectric conversion element 23 and a switching device 24.

The photoelectric conversion element 23 includes a photoconductive layer 25 that receives the fluorescence of the scintillator 11 to generate an electric charge, and a pair of electrodes 26, 27 disposed on front and back surfaces of the photoconductive layer 25, respectively. The electrode 26 disposed on the surface of the scintillator 11 side of the photoconductive layer 25 is a bias electrode that applies bias voltage to the photoconductive layer 25, and the electrode 27 disposed on the opposite side surface is a charge collection electrode that collects the electric charge generated by the photoconductive layer 25. The charge collection electrode 27 is connected with the switching device 24, and the electric charge collected in the charge collection electrode 27 is read out by the switching device 24.

The insulating substrate 20 is provided with a plurality of gate lines 28 that extend in one (row direction) of arrangement directions of the two-dimensionally arranged pixels 22 to turn ON/OFF the switching device 24 of each pixel 22 and a plurality of signal lines (data lines) that extend in a direction (column direction) orthogonal to the gate lines 28 to read out electric charges through the turned ON switching device 24. Each of the gate lines 28 and the signal lines 29 is connected with a connection circuit 31 at a connection terminal portion 30 disposed at an edge of the insulating substrate 20 and is connected with a circuit board (not shown) having a gate driver and a signal processing unit through the connection circuit 31.

The switching devices 24 are sequentially turned ON row by row in accordance with signals supplied from the gate driver through the gate lines 28. The electric charges read out by the turned-ON switching devices 24 are transmitted to the signal lines 29 and input to the signal processing unit as electric charge signals. Therefore, the electric charges are sequentially read out row by row and are converted into electrical signals in the signal processing unit, thereby generating digital image data.

The insulating substrate 20 may be made of, for example, a resin material. A resin material with excellent heat resistance may be desired for the resin material, which may be selected from, for example, polyethylene terephthalate (PET), polyethylene naphthalate (PEN), polyether sulfone (PES), polyether imide, polyether ether ketone, polyphenylene sulfide, polycarbonate (PC), cellulose triacetate (TAC), cellulose acetate propionate (CAP), polyimide, polyarylate, and bi-axially stretched polystyrene (OPS). Those resins may contain organic or inorganic fillers. A flexible resin substrate made of aramid, and bio-nano fiber, having properties, such as low thermal expansion and high strength, which cannot be obtained by the existing resin materials or a flexible glass substrate formed to have a thickness of about 0.1 mm or less may be suitably used. Specifically, the glass substrate is preferable since it has properties such as low thermal expansion and high strength, and generally has more excellent moisture-proof property or gas barrier property than the resin substrate.

The photoelectric conversion element 23 may be configured by an amorphous silicon photodiode in which, for example, a PN junction thin film or a PIN junction thin film of amorphous silicon is used for the photoconductive layer 25. As the photoconductive layer 25, an organic photoelectric conversion film made of an organic compound such as quinacridone, and the like, in addition to amorphous silicon, may also be used. This is desirable in that a film may be formed at a lower temperature as compared to when the amorphous silicon is used, and an increased number of materials may be selected for the insulating substrate 20 from the viewpoint of heat resistance. The organic photoelectric conversion film will be described below.

The switching device 24 may be configured by, for example, a thin film transistor (TFT) in which amorphous silicon is used for an active layer. As a material of the TFT active layer, an amorphous oxide semiconductor material, an organic semiconductor material, and the like may also be used in addition to amorphous silicon, which is desirable in that a film may be formed at a lower temperature as compared to a case where the amorphous silicon is used, and an increased number of materials may be selected for the insulating substrate 20 in view of the heat resistance. The amorphous oxide semiconductor material or the organic semiconductor material will be described below.

The array of the photoelectric conversion elements 23 and the array of the switching devices 24 may be formed on the same layer, and the array of the switching devices 24 and the array of the photoelectric conversion elements 23 may be formed on different layers in this order from the scintillator 11 side. However, as in the illustrated example, it is preferable to sequentially form the array of the photoelectric conversion elements 23 and the array of the switching devices 24 on different layers in this order from the scintillator 11 side. The array of the photoelectric conversion elements 23 and the array of the switching devices 24 are formed on different layers and therefore, the size of the photoelectric conversion elements 23 may be increased. As the array of the photoelectric conversion elements 23 and the array of the switching devices 24 are formed in this order from the scintillator 11 side, the array of the photoelectric conversion elements 23 may be disposed adjacent to the scintillator 11, thereby improving the sensitivity.

Figure 4:
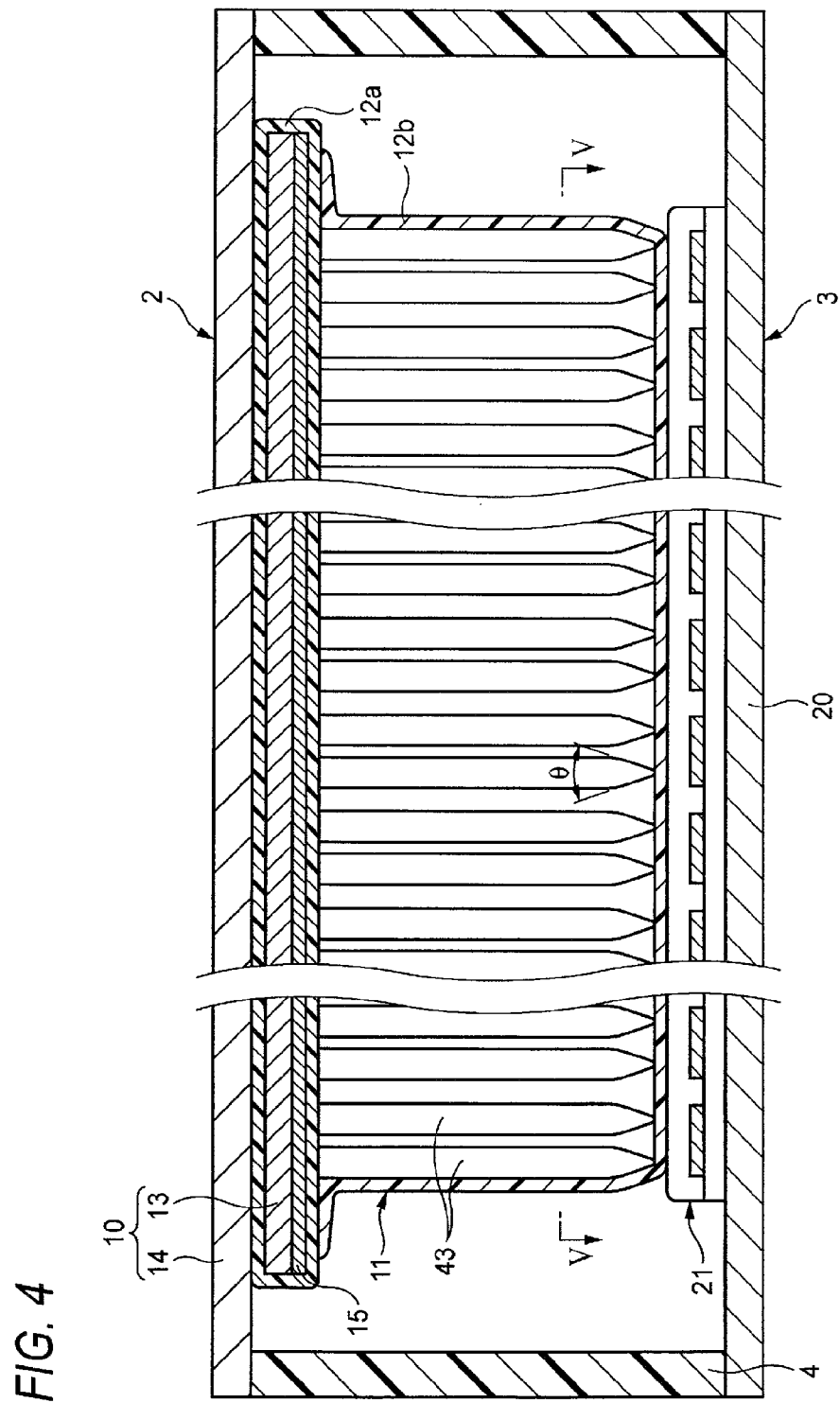
FIG. 4 is a diagram schematically illustrating a configuration of a scintillator of the radiological image detection apparatus of FIG. 1.

FIG. 4 illustrates a configuration of the radiological image conversion panel 2.

In the ISS type radiological image detection apparatus 1, the support substrate 10 is disposed on the opposite side of the radiation incident side, and is configured by stacking a plurality of flexible sheet-shaped base materials. In the present example, the support substrate 10 is configured in two layers of a first base material 13 and a second base material 14. One surface of the first base material 13 is provided with the scintillator 11 and the other surface thereof is bonded to the second base material 14. The second base material 14 reinforces the first base material 13 on which the scintillator 11 is formed and is bonded to the insulating substrate 20 of the sensor panel 3 by the sealant 4 (see FIG. 1).

In connection with the manufacturing process of the scintillator 11 to be described below, as the first base material 13, for example, a flexible resin substrate with excellent heat resistance may be used. As a resin substrate, a resin substrate such as the insulating substrate 20 of the sensor panel 3 may be used. A flexible glass substrate may also be suitably used.

The second base material 14 may have heat resistance in a range of temperature of using the radiological image detection apparatus 1, and a flexible resin substrate or a glass substrate may be used as the second base material 14. However, in view of reinforcing the first base material 13, the second base material 14 is preferably made of a harder material than that of the first base material 13.

The surface of the first base material 13, on which the scintillator 11 is formed, is provided with a reflective film 15. The reflective film 15 is formed by forming a metal thin film having light reflectivity such as aluminum. The metal thin film may be formed on the surface of the first base material 13 by a means such as, for example, deposition.

The scintillator 11 is configured by a group of columnar crystals 43 formed by growing crystals of a phosphor in columnar shapes. Occasionally, a plurality of neighborhood columnar crystals may be combined to form a single columnar crystal. A gap exists between adjacent columnar crystals 43, and the columnar crystals 43 are present independently from each other.

The scintillator 11 is in close contact with the pixel array 21 in a surface (fluorescence emitting surface) configured by a set of tips of the columnar crystals 43. The fluorescence generated from the scintillator 11 upon exposure to radiation is emitted toward the pixel array 21 from the fluorescence emitting surface configured by the set of tips of the columnar crystals 43.

The fluorescence generated from each columnar crystal 43 repeatedly suffers from total reflection within the columnar crystal 43 due to a difference in a refractive index between the columnar crystal 43 and a gap therearound, such that the diffusion of the fluorescence is suppressed, and the fluorescence is optically guided to the pixel array 21. Therefore, the sharpness of the image is improved.

The fluorescence oriented toward an opposite side to the pixel array 21 among the fluorescence generated from each columnar crystal 43 by the radiation exposure is reflected toward the pixel array 21 side by the reflective film 15. Therefore, the use efficiency of the fluorescence is increased and thus, the sensitivity is improved.

Each of the tips of the columnar crystals 43 is formed in a sharply tapered shape. As each of the tips of the columnar crystals 43 is formed in a protruding shape, the extraction efficiency of light and the sensitivity can be improved as compared with a flat shape or a concave shape. The apex angle θ of the tip is preferably 40° to 80°.

As the phosphor forming the scintillator 11 which is configured by a group of columnar crystals, for example, an alkali halide phosphor such as thallium doped cesium iodide (CsI: Tl), thallium doped sodium iodide (NaI:Tl), and sodium doped cesium iodide (CsI:Na) may be used. Among them, CsI:Tl is preferable in that the emission spectrum thereof is suitable for a maximum value (amorphous silicon of around 550 nm, quinacridone of around 560 nm) of spectral sensitivity of a photodiode using amorphous silicon or quinacridone for the photoconductive layer 25.

The first base material 13 on which the reflective film 15 is formed is coated by a protective film 12a since a halogen within the alkali halide phosphor as described above may corrode a metal that is a material of the reflective film 15. The alkali halide phosphor has deliquescency and the scintillator 11 is also coated by the protective film 12b.

As a material of the protective films 12a, 12b, poly paraxylylene is typically used. However, polyethylene terephthalate (PET) or a film made of polymer compounds may also be used, which has low moisture vapor permeability such as polyester, polymethacrylate, nitro cellulose, cellulose acetate, polypropylene, and polyethylene terephthalate.

Figure 5:
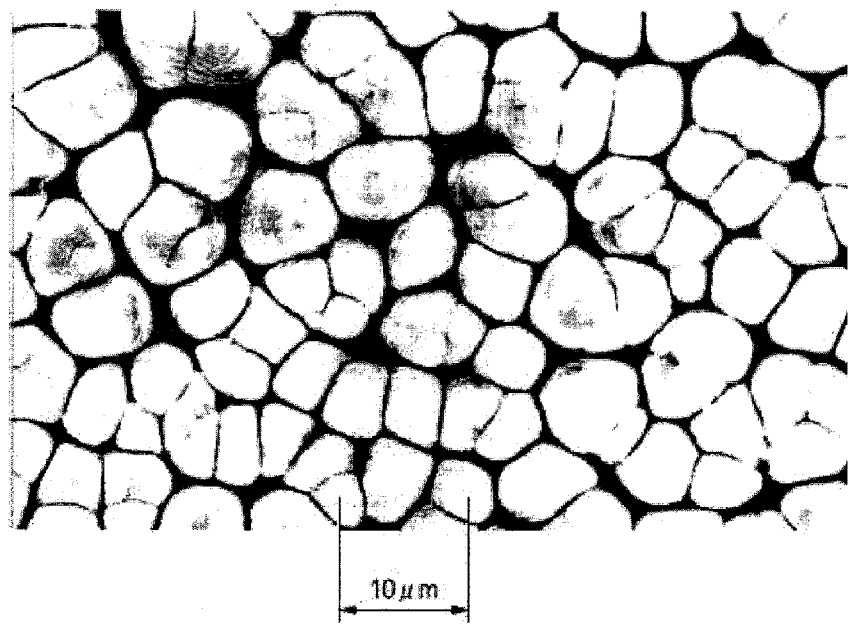
FIG. 5 is a cross-sectional view of the scintillator of FIG. 4 taken along line V-V.

FIG. 5 shows an electron microscope photograph showing a section of the scintillator 13 taken on line IV-IV in FIG. 4.

As is apparent from FIG. 5, it is understood that each columnar crystal 43 shows a substantially uniform sectional diameter with respect to the growth direction of the crystal, and the columnar crystals 43 exist independently of one another due to an air gap around each columnar crystal 43. It is preferable that the crystal diameter (columnar diameter) of each columnar crystal 43 is 2 μm to 8 μm, from the viewpoints of light guide effect, mechanical strength and pixel defect prevention. When the columnar diameter is too small, each columnar crystal 43 is short of mechanical strength so that there is a fear that the columnar crystal 43 may be damaged by a shock or the like. When the crystal diameter is too large, the number of columnar crystals 43 for each image element is reduced so that there is a fear that it is highly likely that the image element may be defective when one of the crystals corresponding thereto is cracked.

Here, the crystal diameter designates the maximum diameter of a columnar crystal 43 observed from above in the growth direction of the crystal. As for a specific measurement method, the columnar diameter of each columnar crystal 43 is measured by observation in an SEM (Scanning Electron Microscope) from the growth-direction top of the columnar crystal 43. The observation is performed in the magnification (about 2,000 times) with which 100 to 200 columnar crystals 43 can be observed in each shot. The maximum values of columnar diameters of all the crystals taken in the shot are measured and averaged. An average value obtained thus is used. The columnar diameters (μm) are measured to two places of decimals, and the average value is rounded in the two places of decimals according to JIS Z 8401.

The lengths of the columnar crystals 43 (the thickness of the scintillator 11) may be set depending on the energy of radiation, but may well be set preferably in a range of from 200 μm to 700 μm in view of radiation adsorption and the sharpness of an image in the scintillator 11. When the thickness of the scintillator 11 is too thin, the radiation may not be sufficiently absorbed and the sensitivity may be degraded, and when the thickness thereof is too thick, the optical diffusion may be caused and thus the sharpness of an image may also be degraded in spite of the light guide effect of the columnar crystals 43.

The scintillator 11 may be manufactured by the vapor deposition method. When CsI:Tl is used as the phosphor, the CsI:Tl is heated and vaporized by, for example, conducting electricity to, for example, a resistive heating crucible, under a degree of vacuum of 0.01 Pa to 10 Pa, the crystals of CsI:Tl are deposited and grown on the first base material 13 under the temperature of the first base material 13 in a range from room temperature (20° C.) to 300° C. in columnar shapes.

The temperature of the first base material 13 is controlled at the end stage of growing the columnar crystals 43 to control the shape of the tip of each of the columnar crystals 43 (tip angle (apex angle) θ). Generally, the tip angle is formed as 170° at 110° C., 60° at 140° C., 70° at 200° C., and 120° at 260° C.

During the manufacturing process of the scintillator 11 as described above, the lengths of the columnar crystals 43 may vary locally due to, for example, deflection of vapor of the phosphor and abnormal growth of the crystals, and thus, unevenness may be formed on the fluorescence emitting surface of the scintillator 11. Hereinafter, a configuration will be described in which the unevenness is absorbed to make the scintillator 11 come into close contact with the pixel array 21 in its entirety without a gap.

Figure 6A:
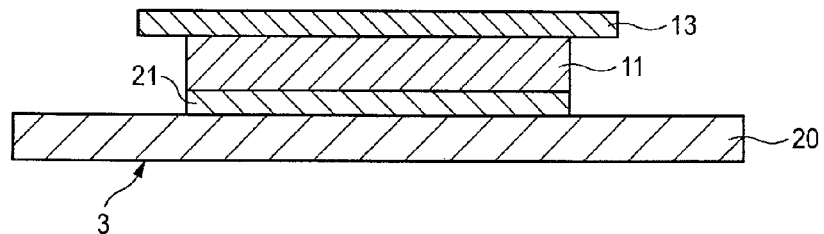
FIGS. 6A to 6C are diagrams schematically illustrating an example of a method for manufacturing the radiological image detection apparatus of FIG. 1.
Figure 6B:
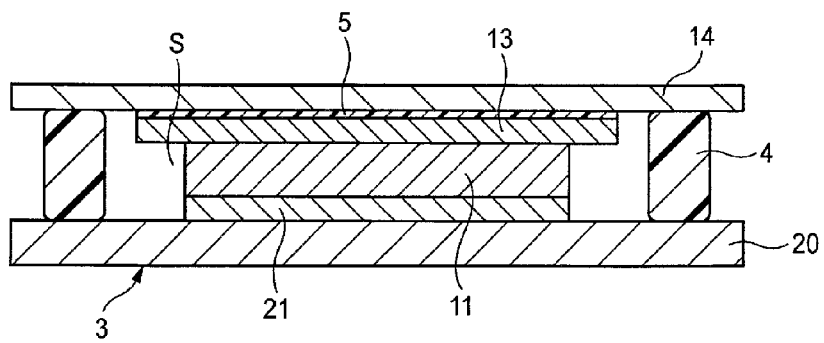
Figure 6C:
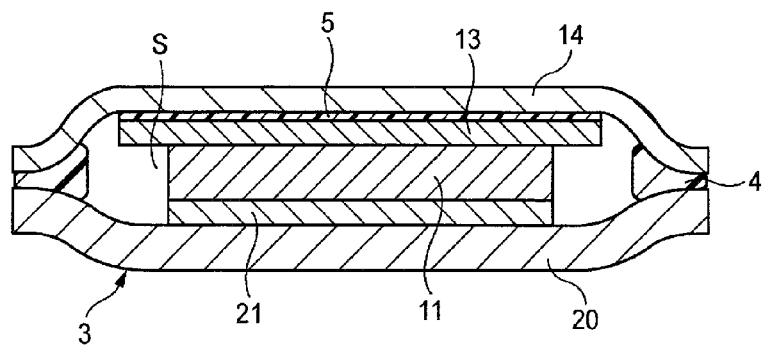

FIGS. 6A to 6C illustrate an example of a method for manufacturing the radiological image detection apparatus 1.

First, the first base material 13 on which the scintillator 11 is formed, the second base material 14 configuring the support substrate 10 of the radiological image conversion panel 2 together with the first base material 13, and the sensor panel 3 are prepared.

The first base material 13 is disposed on the sensor panel 3 and the fluorescence emitting surface of the scintillator 11 is pressed over the pixel array 21 (see FIG. 6A). When there is unevenness on the fluorescence emitting surface of the scintillator 11, the first base material 13 is deformed to absorb the unevenness. That is, for the convex portion of the fluorescence emitting surface, an area of the first base material 13 overlapped to the convex portion and a peripheral area thereof are uplifted to be separated from the sensor panel 3, and for the concave portion of the fluorescence emitting surface, an area of the first base material 13 overlapped with the concave portion and a peripheral area thereof are depressed to come in close proximity to the sensor panel 3.

Subsequently, an adhesive 5 is applied to any one or both of the bonded surfaces of the first base material 13 and the second base material 14, an adhesive serving as the sealant 4 is applied to any one or both of the second base material 14 and the insulating substrate 20 of the sensor panel 3, and then the second base material 14 is overlapped with the first base material 13 and the insulating substrate 20 (see FIG. 6B).

Before the adhesive 5 interposed between the first base material 13 and the second base material 14 and the adhesive as the sealant 4 interposed between the second base material 14 and the insulating substrate 20 are cured, the space S formed by the sealant 4 is depressurized. As the space S is depressurized, the second base material 14 and the insulating substrate 20 are deformed, thereby reducing the volume of the space S. The scintillator 11 and the pixel array 21 are compressed to each other by the deformation of the second base material 14 and the insulating substrate 20, and both of the scintillator 11 and the pixel array 21 come into close contact with each other without a gap so as not be bonded to each other (see FIG. 6C).

In this state, the first base material 13 and the second base material 14 are bonded to each other by the adhesive 5 interposed between them, and the second base material 14 and the insulating substrate 20 are bonded to each other by the adhesive serving as the sealant 4 interposed between them, thereby obtaining the radiological image detection apparatus 1.

FIGS. 7A to 7C and 8A to 8C schematically illustrate the deformation of the first base material 13 and a behavior of the group of columnar crystals 43 forming the scintillator 11.

According to the deformation of the first base material 13, the gaps between the tips of the plurality of columnar crystals 43 in the deformed area are expanded or reduced.

Figure 7A:
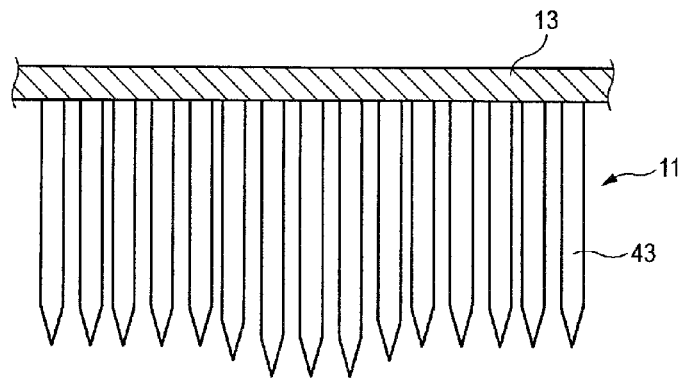
FIGS. 7A to 7C are diagrams schematically illustrating a behavior of the scintillator during the manufacturing process of FIG. 6.
Figure 7B:
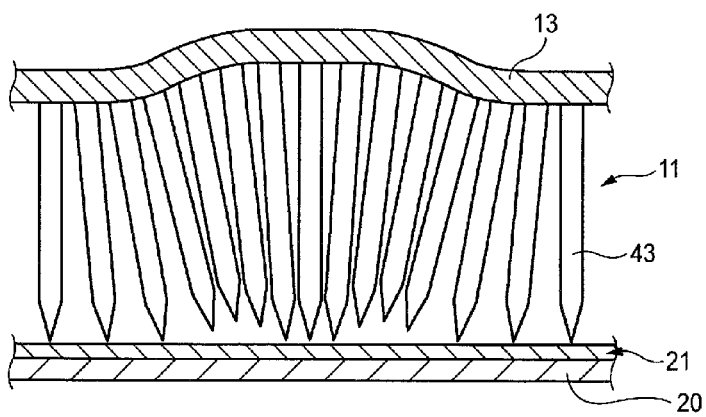
Figure 7C:
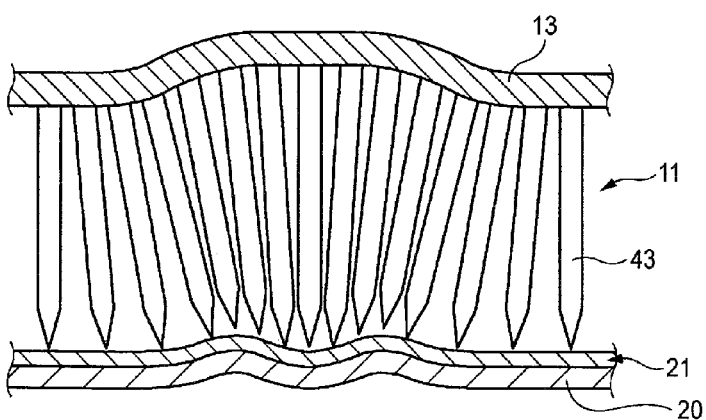

As illustrated in FIGS. 7A to 7C, when the convex portion is present on the fluorescence emitting surface of the scintillator 11 (see FIG. 7A), the fluorescence emitting surface of the scintillator 11 is compressively covered by the pixel array 21. Thus, when the first base material 13 is uplifted, the gaps between the tips of the plurality of columnar crystals 43 are reduced at the central portion of the deformed area. When the columnar crystals 43 collide with each other at the tips thereof, a further deformation of the first base material 13 is limited. As a result, the gaps remain between the scintillator 11 and the pixel array 21 around the convex portion (see FIG. 7B). Therefore, the insulating substrate 20 is also formed flexible to be deformed along the fluorescence emitting surface of the scintillator 11 by depressurizing the space S receiving the scintillator 11 and the pixel array 21. Therefore, the scintillator 11 and the pixel array 21 may come into close contact with each other in its entirety without a gap and not to be bonded to each other (see FIG. 7C).

Figure 8A:
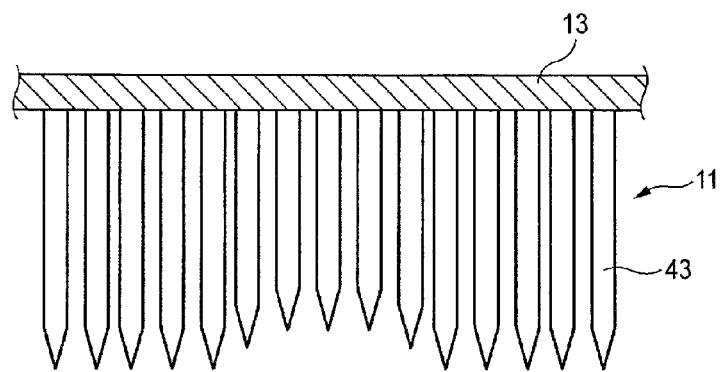
FIGS. 8A to 8C are diagrams schematically illustrating a behavior of the scintillator during the manufacturing process of FIG. 6.
Figure 8B:
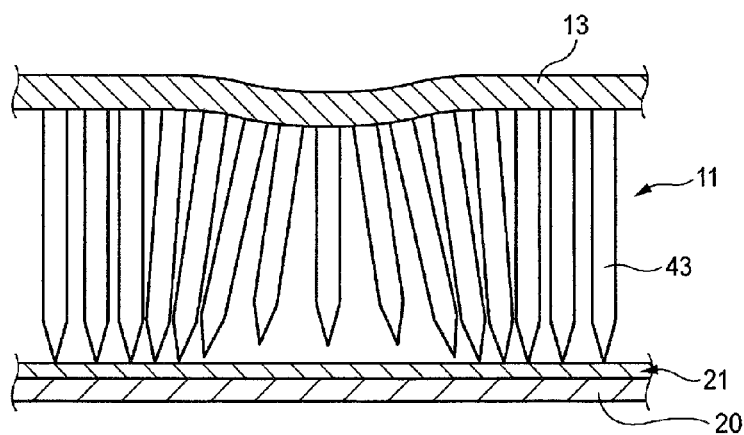
Figure 8C:
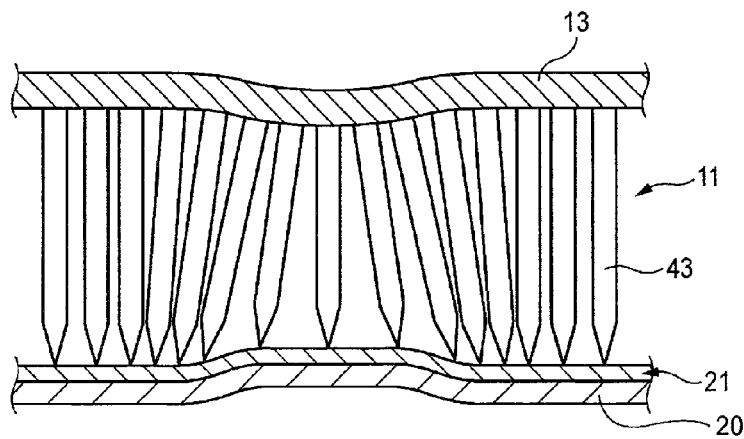

As illustrated in FIGS. 8A to 8C, when the concave portion is present on the fluorescence emitting surface of the scintillator 11, the fluorescence emitting surface of the scintillator 11 is compressively covered by the pixel array 21 to make the first base material 13 sink, the gaps between the tips of the plurality of columnar crystals 43 are reduced at an edge of the deformed area. When the columnar crystals 43 collide with each other at the tips, further deformation of the first base material 13 is also limited. As a result, the gaps remain between the scintillator 11 and the pixel array 21 in the concave portion (see FIG. 8B). Therefore, the insulating substrate 20 is also formed flexible to be deformed along the fluorescence emitting surface of the scintillator 11 by depressurizing the space S receiving the scintillator 11 and the pixel array 21. Therefore, the scintillator 11 may come into close contact with the pixel array 21 without a gap and not to bonded to each other (see FIG. 8C).

As described above, in the radiological image detection apparatus 1, the scintillator 11 and the pixel array 21 are placed in the space S formed by the support substrate 10 supporting the scintillator 11, the insulating substrate 20 supporting the pixel array 21, and the sealant 4, and the space S is depressurized to make the scintillator 11 and the pixel array 21 come into close contact with each other without being bonded to each other. The scintillator 11 and the pixel array 21 may come into close contact with each other without a gap by forming both of the support substrate 10 and the insulating substrate 20 by flexible ones. Therefore, the uniformity of the image quality can be improved.

In the ISS type radiological image detection apparatus 1, the support substrate 10 disposed on the opposite side to the radiation incident side may be a stacked structure of the first base material 13 and the second base material 14 to reinforce the radiological image detection apparatus 14, thereby increasing load resistance and impact resistance without causing the degradation in sensitivity caused by the radiation absorption.

In the manufacturing method as described above, the first base material 13 formed with the scintillator 11 is deformed and then the second base material 14 is bonded to the first base material 13 and the insulating substrate 20. As a result, the first base material 13 may be deformed without damaging the flexibility of the first base material 13. In addition, after the second base material 14 is bonded to the first base material 13 and the insulating substrate 20, it is possible to secure the load resistance and impact resistance of the radiological image detection apparatus 1.

Since the scintillator 11 and the pixel array 21 are not bonded to each other, the radiological image conversion panel 2 and the sensor panel 3 may be easily separated from each other. When any one of the radiological image conversion panel 2 and the sensor panel 3 is damaged, only the damaged panel may be replaced to recycle the panels as the radiological image detection apparatus 1.

From the viewpoint of recycling (rework), either of the adhesive serving as the sealant 4 for bonding the second base material 14 and the insulating substrate 20 to each other or the adhesive 5 for bonding the first base material 13 and the second base material 14 to each other, is preferably a dismantlable adhesive of which the bonding strength is degraded by energy irradiation. As such, the radiological image conversion panel and the sensor panel may be more easily separated from each other, and the scintillator 11 and the pixel array 21 may come into close contact with each other without a gap and not to be bonded to each other such that the panels can be recycled as the radiological image detection apparatus 1 through the manufacturing method as described above.

As for the dismantlable adhesive, for example, an adhesive formed by heating and softening a thermoplastic resin, an adhesive mixed with thermally expandable microcapsules or a foaming agent, an adhesive peeled off by ultraviolet irradiation, and the like, may be used.

Figure 9:
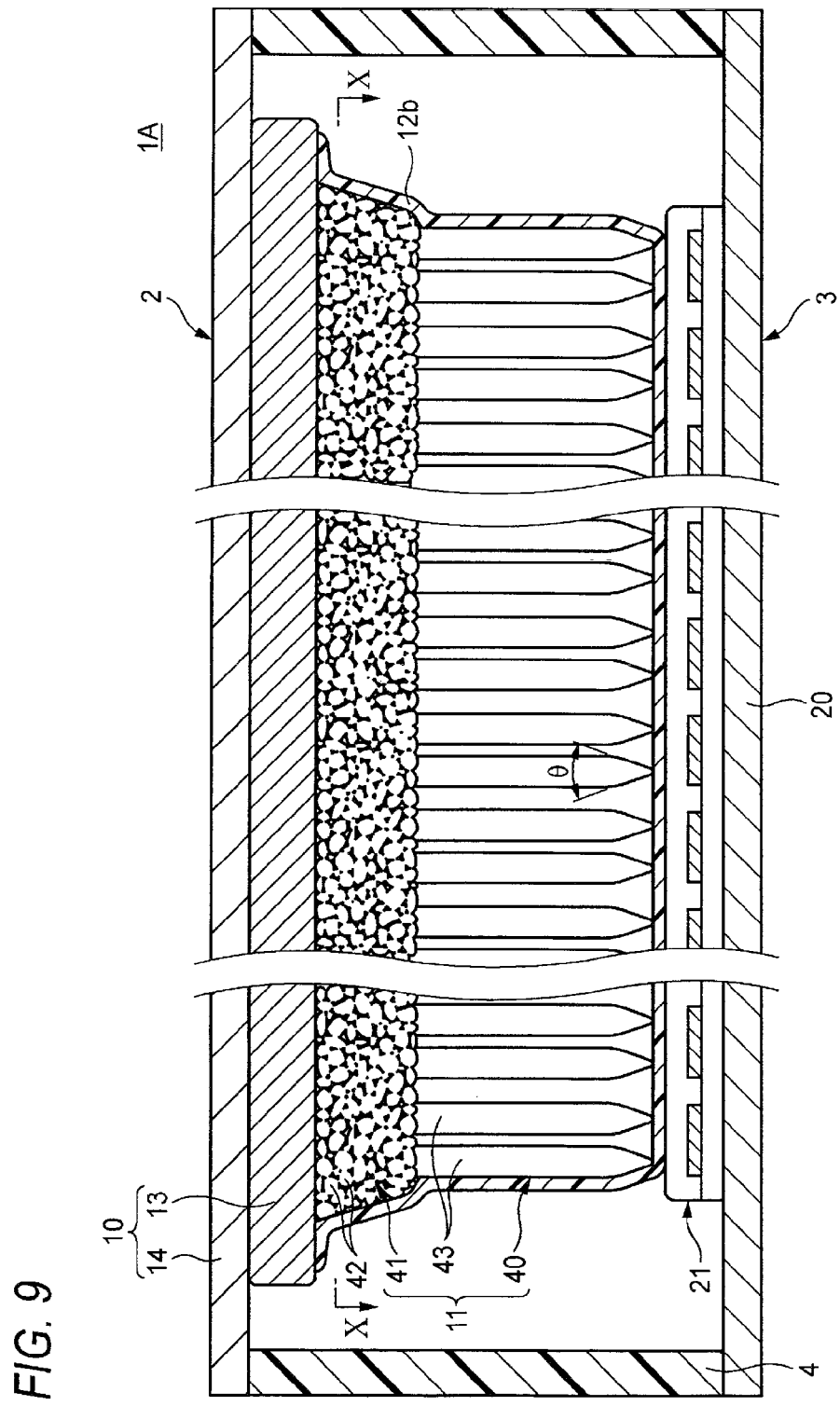
FIG. 9 is a diagram schematically illustrating a configuration of a modified example of the radiological image detection apparatus of FIG. 1.

FIG. 9 illustrates a modified example of the radiological image detection apparatus 1.

In a radiological image detection apparatus 1A illustrated in FIG. 9, the scintillator 11 includes a columnar portion 40 formed of a group of columnar crystals 43 and a non-columnar portion 41. The columnar portion 40 and the non-columnar portion 41 are overlappingly formed on the support substrate 10 in the order of the non-columnar portion 41 and the columnar portion 40.

The non-columnar portion 41 is formed by a group of relatively small granular crystals 42 of a fluorescent material. An amorphous material of the fluorescent material may be contained in the non-columnar portion 41. In the non-columnar portion 41, the granular crystals are present in the state where they are irregularly bonded or overlapped to each other.

The non-columnar portion 41 has fine voids scattered therein. Due to the presence of the voids the non-columnar portion 41 may be replaced by the reflective film 15 of the support substrate 10 in the radiological image detection apparatus 1 as described above.

The non-columnar portion 41 is denser than the columnar portion 40, and the porosity of the non-columnar portion 41 is smaller than that of the columnar portion 40. Since the non-columnar portion 41 is interposed between the support substrate 10 and the columnar portion 40, the adhesion between the support substrate 10 and the scintillator 11 may be improved, thereby preventing the scintillator 11 from being stripped from the support substrate 10.

Figure 10:
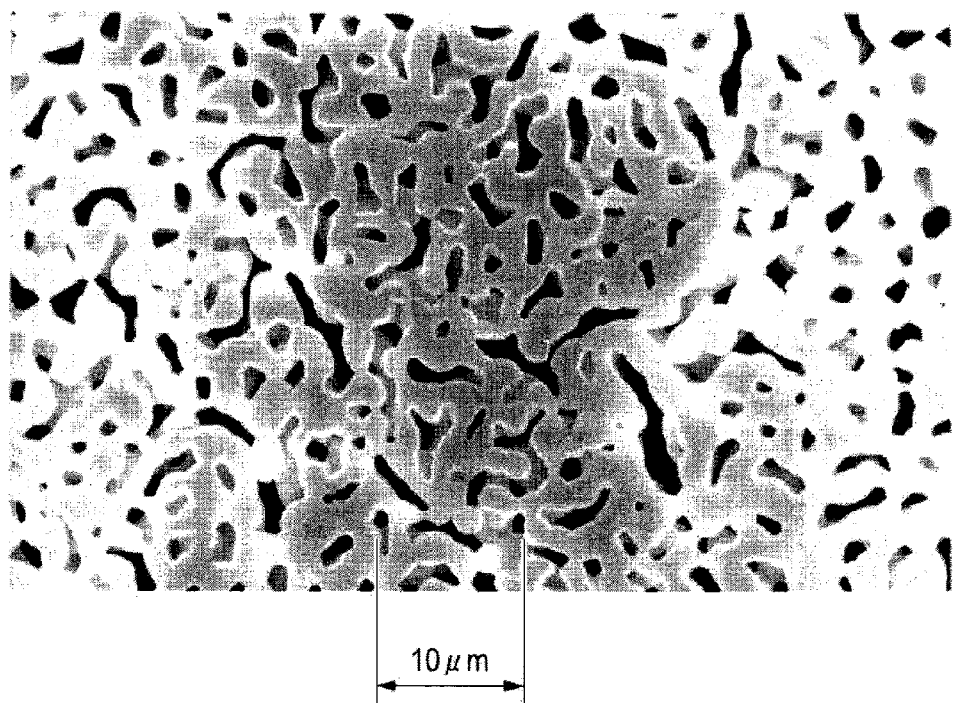
FIG. 10 is a cross-sectional view of the scintillator of FIG. 9 taken along line X-X.

FIG. 10 shows an electron microscope photograph showing a section of the scintillator 11 taken on line X-X in FIG. 9.

As is apparent from FIG. 10, in the non-columnar portion 41, crystals are irregularly coupled or laid on one another of the granular crystals 42 so that no distinct air gap among the crystals can be recognized in comparison with the columnar portion 40. From the viewpoints of adhesion and optical reflection, it is preferable that the diameter of each of the granular crystals 42 forming the non-columnar portion 41 is 0.5 μm to 7.0 μm. When the crystal diameter is too small, the void ratio is close to zero so that there is a fear that the function of optical reflection may deteriorate. When the crystal diameter is too large, the flatness deteriorates so that there is a fear that the adhesion to the support substrate 10 may deteriorate. In addition, from the viewpoint of optical reflection, it is preferable that the shapes of the granular crystals 42 forming the non-columnar portion 31 are substantially spherical.

When crystals are coupled, the crystal diameter of each crystal is measured as follows. That is, a line obtained by connecting recesses (concaves) generated between adjacent crystals is regarded as the boundary between the crystals. The crystals coupled with each other are separated to have minimum polygons and the crystal diameters of the polygons are measured. An average value of the crystal diameters is obtained in the same manner as the crystal diameter in the columnar portion 40. The average value obtained thus is used.

It is preferable that the thickness of the non-columnar portion 41 is 5 μm to 125 μm from the viewpoint of adhesion to the support substrate 10 and optical reflection. When the thickness of the non-columnar portion 41 is too small, there is a fear that sufficient adhesion to the support substrate 10 cannot be obtained. When the thickness of the non-columnar portion 41 is too large, contribution of fluorescence in the non-columnar portion 41 and diffusion caused by optical reflection in the non-columnar portion 41 increase so that there is a fear that the image sharpness may deteriorate.

The non-columnar portion 41 and the columnar portion 40 are formed by a vapor deposition method integrally and continuously. Specifically, under the environment with a vacuum degree of 0.01 to 10 Pa, CsI:Tl is heated and evaporated by means of resistance heating crucibles to which electric power is applied. Thus, CsI:Tl is deposited on the first base material 13 whose temperature is set at a room temperature (20° C.) to 300° C.

At the beginning of formation of a crystal phase of CsI:Tl on the first base material 13, comparatively small-diameter crystals are deposited to form the non-columnar portion 41. At least one of the conditions, that is, the degree of vacuum or the temperature of the first base material 13 is then changed. Thus, the columnar portion 40 is formed continuously after the non-columnar portion 41 is formed. Specifically, the degree of vacuum and/or the temperature of the first base material 13 are increased so that a group of columnar crystals 43 are grown.

Figure 11:
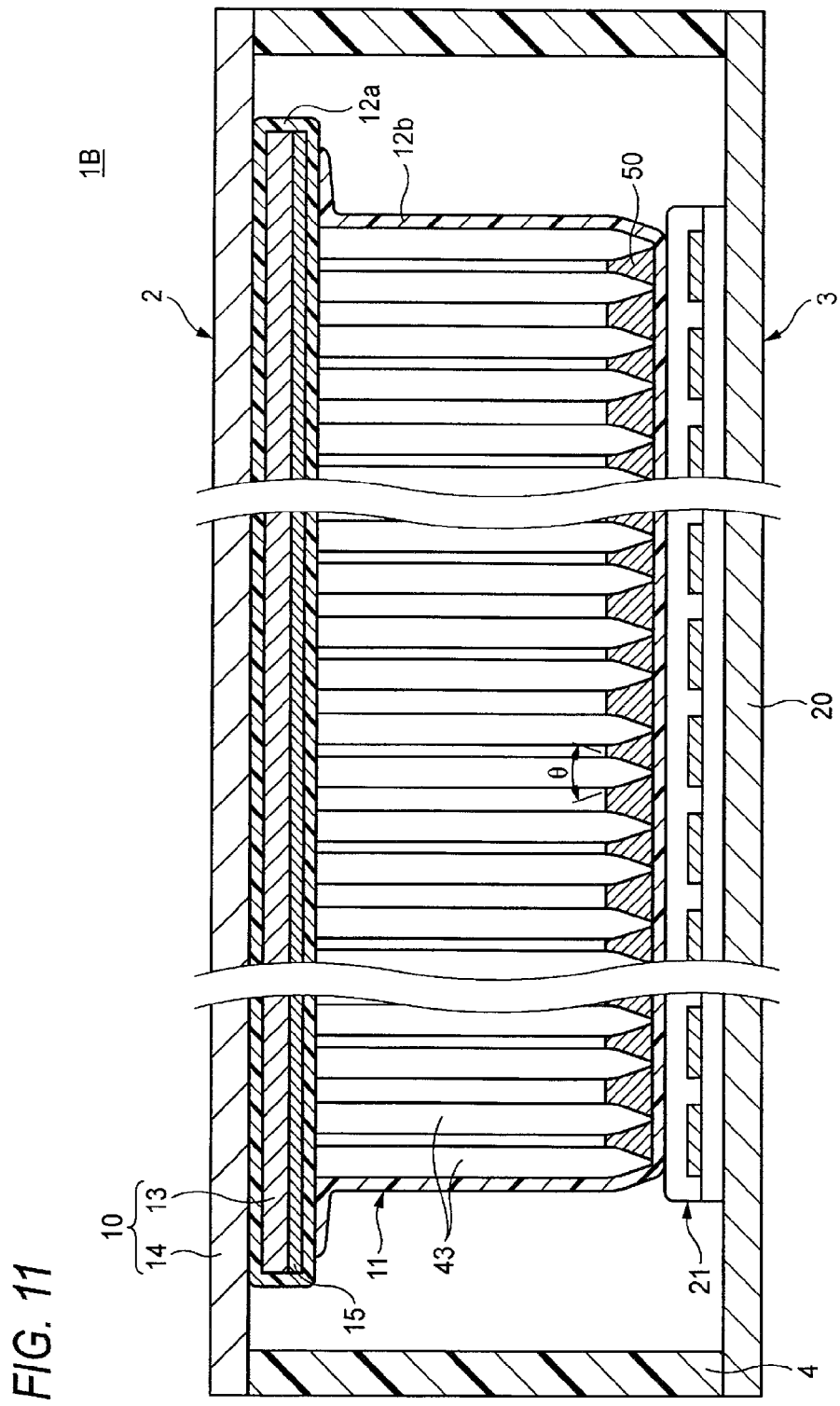
FIG. 11 is a diagram schematically illustrating a configuration of a radiological image detection apparatus according to another exemplary embodiment of the present invention.

FIG. 11 illustrates another modified example of the radiological image detection apparatus 1.

In a radiological image detection apparatus 1B illustrated in FIG. 11, a filler 50 is filled between the group of columnar crystals 43 of the scintillator 11 at the tip end side of the columnar crystals 43.

The fluorescence emitting surface of the scintillator 11 is configured by a group of columnar crystals 43, and the tip of each columnar crystal 43 is formed in a sharply tapered shape in the viewpoint of the extraction efficiency of light. For this reason, if the filler 50 is not present, when the scintillator 11 is compressively covered by the pixel array 21, load may be concentrated on the tips of the columnar crystals 43 to deform the tips, and damage the pixel array 21. However, the load is distributed due to the presence of the filler 50, thereby preventing the deformation of the tips of the columnar crystals 43 and the damage of the pixel array 21.

Since the filler 50 is filled in the group of columnar crystals 43, it is possible to prevent the protective film 12b from entering between the columnar crystals 43. As the protective film 12b, for example, the poly paraxylylene is used as described above. However, since the refractive index of the protective film 12b is larger than the refractive index of air (1.0). When the protective film 12b is introduced into the group of columnar crystals 43, a difference in refractive index between the columnar crystals 43 and a medium around thereof is lowered at the portions where the protective film 12b is introduced, thereby reducing the light guide effect of the columnar crystals 43 and degrading the sharpness of an image. However, since the filler 50 is filled in the group of columnar crystals 43, it is possible to prevent the protective film 12b from being introduced into the group of columnar crystals 43.

As the filler 50, an energy curable resin material may be suitably used, which is transparent to the fluorescence generated from the scintillator 11 and has appropriate fluidity. Specifically, a phenol resin, a urea resin, a melamine resin, an unsaturated polyester resin, an epoxy resin, and a diarylphthalate resin, may be exemplified.

In the viewpoint of suppressing the reducing of the light guide effect of the columnar crystal 43 by the protective film 12b, a filler having a refractive index smaller than that of the protective film 12b may preferably be used as the filler 50. For example, considering that the refractive index of CsI:Tl used as the phosphor of the columnar crystal 43 is 1.79 and the refractive index of the poly paraxylylene used as the protective film 12b is 1.639, it is preferable that the refractive index of the filler 50 is 1.6 or less. The refractive indexes of the foregoing materials exemplified as the filler 50 fluctuate according to, for example, the grade thereof. The refractive index of a pinolene resin is 1.58 to 1.66, the refractive index of an urea resin is 1.54 to 1.56, the refractive index of a melamine resin is 1.6 to 1.7, the refractive index of an unsaturated polyester resin is 1.52 to 1.57, the refractive index of an epoxy resin is 1.55 to 1.61, and the refractive index of a diarylphthalate resin is 1.51 to 1.52.

Figure 12:
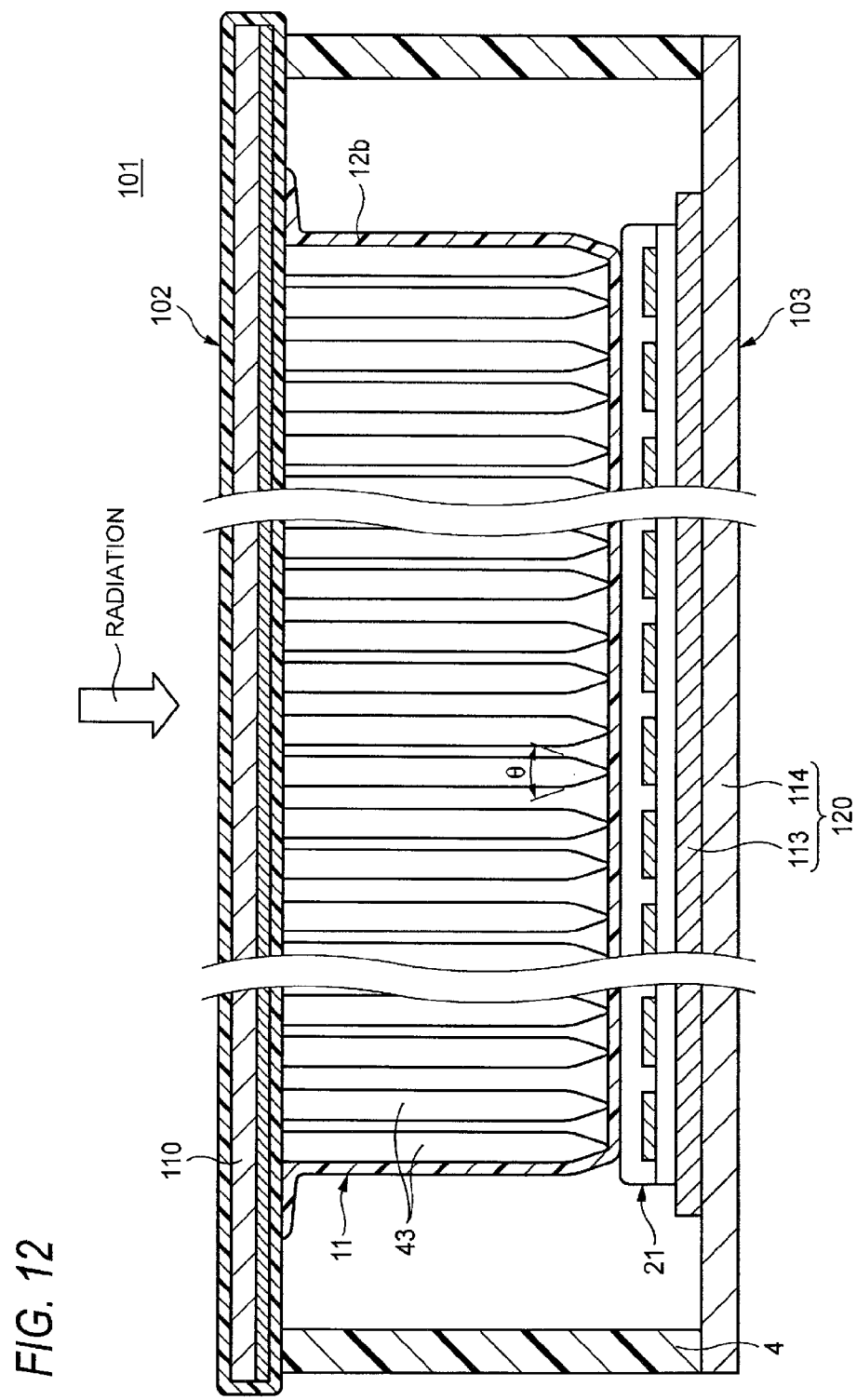
FIG. 12 is a diagram schematically illustrating a configuration of a radiological image detection apparatus according to yet another exemplary embodiment of the present invention.

FIG. 12 schematically illustrates a configuration of a radiological image detection apparatus for describing another exemplary embodiment of the present invention. Components common to the radiological image detection apparatus 1 as described above are denoted by common reference numerals, and the description thereof will be omitted or briefly described.

A radiological image detection apparatus 101 illustrated in FIG. 12 includes a radiological image conversion panel 102 and a sensor panel 103.

The radiological image conversion panel 102 includes a flexible support substrate (first substrate) 110 and a scintillator 11 formed of a phosphor generating fluorescence by radiation exposure. The scintillator 11 is disposed on the support substrate 110.

The sensor panel 103 includes a flexible insulating substrate (second substrate) 120 and a pixel array 21 disposed on the insulating substrate 120. Each of the pixels of the pixel array 21 detects fluorescence generated from the scintillator 11.

The radiological image conversion panel 102 and the sensor panel 103 are disposed such that the scintillator 11 and the pixel array 21 are opposed to each other, and are bonded to each other by the sealant 4.

The sealant 4 is disposed to surround the scintillator 11 and the pixel array 21 between the support substrate 110 of the radiological image conversion panel 102 and the insulating substrate 120 of the sensor panel 103, and forms an isolated space S on the inside thereof.

The space S is in a depressurized state as compared to the outside thereof. As the support substrate 110 and the insulating substrate 120 are deformed, the scintillator 11 comes into close contact with the pixel array 21 without being bonded to the pixel array 21.

The radiological image detection apparatus 101 is a so-called penetration side sampling (PSS) type radiological image detection apparatus, and the radiological image conversion panel 102 and the sensor panel 103 are arranged in this order from a radiation incident side. The radiation penetrates the support substrate 110 to be incident to the scintillator 11. In the scintillator 11 to which the radiation is incident, the fluorescence is generated and the fluorescence generated therefrom is detected by the pixel array 21.

In the PSS type radiological image detection apparatus 101, the insulating substrate 120 disposed on the opposite side to the radiation incident side is configured in two layers of a first base material 113 and a second base material 114 which are flexible sheet-shaped. One surface of the first base material 113 is provided with the pixel array 21 and the other surface thereof is bonded to the second base material 114. The second base material 114 reinforces the first base material 113 on which the pixel array 21 is formed, and is bonded to the support substrate 110 of the radiological image conversion panel 102 by the sealant 4 (see FIG. 1).

In the radiological image detection apparatus 101, the scintillator 11 and the pixel array 21 are placed in the space S formed by the support substrate 110 supporting the scintillator 11, the insulating substrate 120 supporting the pixel array 21, and the sealant 4, and the scintillator 11 comes into close contact with the pixel array 21 without being bonded to the pixel array 21 as the space S is depressurized. The scintillator 11 may come into close contact with the pixel array 21 in its entirety without a gap as both of the support substrate 110 and the insulating substrate 120 are formed from flexible ones. Therefore, the uniformity of an image quality can be improved.

In the PSS type radiological image detection apparatus 101, the insulating substrate 120 disposed on the opposite side to the radiation incident side may be a stacked structure of the first base material 113 and the second base material 114 to reinforce the radiological image detection apparatus 101, thereby increasing load resistance and impact resistance without causing the degradation in sensitivity caused by the radiation absorption.

Since the aforementioned radiological image detection apparatus can detect a radiological image with high sensitivity and high definition, it can be installed and used in an X-ray imaging apparatus for the purpose of medical diagnosis, such as a mammography apparatus, required to detect a sharp image with a low dose of radiation, and other various apparatuses. For example, the radiological image detection apparatus is applicable to an industrial X-ray imaging apparatus for nondestructive inspection, or an apparatus for detecting particle rays (α-rays, β-rays, γ-rays) other than electromagnetic waves. The radiological image detection apparatus has a wide range of applications.

Description will be made below on materials which can be used for constituent members of the sensor panel.

[Photoelectric Conversion Element]

A film formed out of the OPC material (hereinafter referred to as OPC film) disclosed in JP-A-2009-32854 may be used for the photoconductive layer 25 (see FIG. 2) of the aforementioned photoelectric conversion elements 23. The OPC film contains an organic photoelectric conversion material, absorbing light emitted from a phosphor and generating electric charges in accordance with the absorbed light. Such an OPC film containing an organic photoelectric conversion material has a sharp absorption spectrum in a visible light range. Thus, electromagnetic waves other than light emitted from the phosphor are hardly absorbed by the OPC film, but noise generated by radiation such as X-rays absorbed by the OPC film can be suppressed effectively.

It is preferable that the absorption peak wavelength of the organic photoelectric conversion material forming the OPC film is closer to the peak wavelength of light emitted by the phosphor in order to more efficiently absorb the light emitted by the phosphor. Ideally, the absorption peak wavelength of the organic photoelectric conversion material agrees with the peak wavelength of the light emitted by the phosphor. However, if the difference between the absorption peak wavelength of the organic photoelectric conversion material and the peak wavelength of the light emitted by the phosphor is small, the light emitted by the phosphor can be absorbed satisfactorily. Specifically, the difference between the absorption peak wavelength of the organic photoelectric conversion material and the peak wavelength of the light emitted by the phosphor in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the phosphor material, the aforementioned difference in peak wavelength can be set within 5 nm so that the amount of electric charges generated in the OPC film can be increased substantially to the maximum.

At least a part of an organic layer provided between the bias electrode 26 and the charge collection electrode 27 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, Spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the phosphor layer. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[Switching Device]

Any organic material, for example, as disclosed in JP-A-2009-212389, may be used for an active layer of each switching device 24. Although the organic TFT may have any type of structure, a field effect transistor (FET) structure is the most preferable. In the FET structure, a gate electrode is provided on a part of an upper surface of an insulating substrate, and an insulator layer is provided to cover the electrode and touch the substrate in the other portion than the electrode. Further, a semiconductor active layer is provided on an upper surface of the insulator layer, and a transparent source electrode and a transparent drain electrode are disposed on a part of an upper surface of the semiconductor active layer and at a distance from each other. This configuration is called a top contact type device. However, a bottom contact type device in which a source electrode and a drain electrode are disposed under a semiconductor active layer may be also used preferably. In addition, a vertical transistor structure in which a carrier flows in the thickness direction of an organic semiconductor film may be used.

(Active Layer)

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) μ which indicates the mobility of a carrier in an organic semiconductor layer. Although preferred mobility varies in accordance with applications, higher mobility is generally preferred. The mobility is preferably not lower than $1.0*10^{-7}$ cm$^2$/Vs, more preferably not lower than $1.0*10^{-6}$ cm$^2$/Vs, further preferably not lower than $10*10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

A phthalocyanine compound or a naphthalocyanine compound may be exemplified as such a p-type organic semiconductor material. A specific example thereof is shown as follows. M represents a metal atom, Bu represents a butyl group, Pr represents a propyl group, Et represents an ethyl group, and Ph represents a phenyl group.

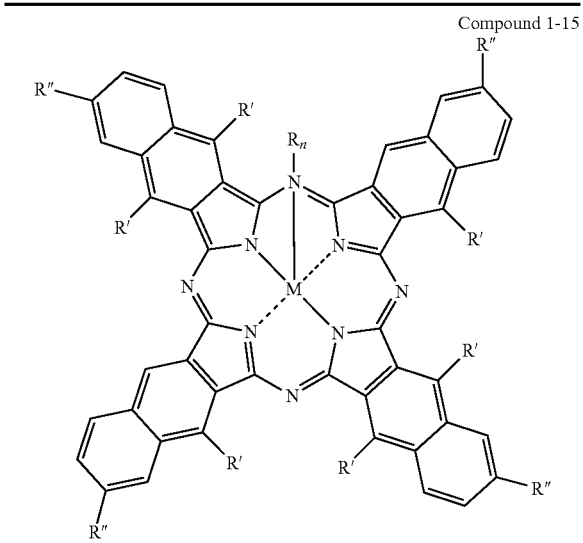

Compound 1-15

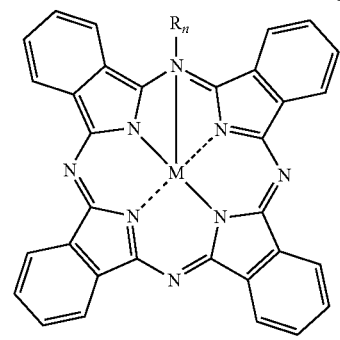

Compound 16-20

| Compound | M | R | n | R' | R'' |
|---|---|---|---|---|---|
| 1 | Si | OSi(n-Bu)₃ | 2 | H | H |
| 2 | Si | OSi(i-Pr)₃ | 2 | H | H |
| 3 | Si | OSi(OEt)₃ | 2 | H | H |
| 4 | Si | OSiPh₃ | 2 | H | H |
| 5 | Si | O(n-C₈H₁₇) | 2 | H | H |
| 7 | Ge | OSi(n-Bu)₃ | 2 | H | H |
| 8 | Sn | OSi(n-Bu)₃ | 2 | H | H |
| 9 | Al | OSi(n-C₆H₁₃)₃ | 1 | H | H |
| 10 | Ga | OSi(n-C₆H₁₃)₃ | 1 | H | H |
| 11 | Cu | — | — | O(n-Bu) | H |
| 12 | Ni | — | — | O(n-Bu) | H |
| 13 | Zn | — | — | H | t-Bu |
| 14 | V=O | — | — | H | t-Bu |
| 15 | H₂ | — | — | H | t-Bu |
| 16 | Si | OSiEt₃ | 2 | — | — |
| 17 | Ge | OSiEt₃ | 2 | — | — |
| 18 | Sn | OSiEt₃ | 2 | — | — |
| 19 | Al | OSiEt₃ | 2 | — | — |
| 20 | Ga | OSiEt₃ | 1 | — | — |

(Constituent Members of Switching Device Other Than Active Layer)

The material forming the gate electrode, the source electrode or the drain electrode is not limited particularly if it has required electric conductivity. Examples thereof include: transparent electrically conductive oxides such as ITO (indium-doped tin oxide), IZO (indium-doped zinc oxide), $SnO_2$, ATO (antimony-doped tin oxide), ZnO, AZO (aluminum-doped zinc oxide), GZO (gallium-doped zinc oxide), $TiO_2$, FTO (fluorine-doped tin oxide), etc.; transparent electrically conductive polymers such as PEDOT/PSS (poly(3,4-ethylenedioxythiophene)/polystyrenesulfonate); carbon materials such as carbon nanotube; etc. These electrode materials may be formed into films, for example, by a vacuum deposition method, sputtering, a solution application method, etc.

The material used for the insulating layer is not limited particularly as long as it has required insulating effect. Examples thereof include: inorganic materials such as silicon dioxide, silicon nitride, alumina, etc.; and organic materials such as polyester (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a vacuum deposition method, sputtering, a solution application method, etc.

As for any other configuration about the aforementioned organic TFT, for example, refer to the description in JP-A-2009-212389.

In addition, for example, amorphous oxide disclosed in JP-A-2010-186860 may be used for the active layer of the switching devices 24. Here, description will be made on an amorphous oxide containing active layer belonging to an FET transistor disclosed in JP-A-2010-186860. The active layer serves as a channel layer of the FET transistor where electrons or holes can move.

The active layer is configured to contain an amorphous oxide semiconductor. The amorphous oxide semiconductor can be formed into a film at a low temperature. Thus, the amorphous oxide semiconductor can be formed preferably on a flexible substrate. The amorphous oxide semiconductor used for the active layer is preferably of amorphous oxide containing at least one kind of element selected from a group consisting of In, Sn, Zn and Cd, more preferably of amorphous oxide containing at least one kind of element selected from a group consisting of In, Sn and Zn, further preferably of amorphous oxide containing at least one kind of element selected from a group consisting of In and Zn.

Specific examples of the amorphous oxide used for the active layer include $In_2O_3$, ZnO, $SnO_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method for forming the active layer. Of vapor phase film formation methods, a sputtering method or a pulse laser deposition (PLD) method is suitable. Further, the sputtering method is preferred in view from mass productivity. For example, the active layer is formed by an RF magnetron sputtering deposition method with a controlled degree of vacuum and a controlled flow rate of oxygen.

By a known X-ray diffraction method, it can be confirmed that the active layer formed into a film is an amorphous film. The composition ratio of the active layer is obtained by an RBS (Rutherford Backscattering Spectrometry) method.

In addition, the electric conductivity of the active layer is preferably lower than $10^2$ Scm$^{-1}$ and not lower than $10^{-4}$ Scm$^{-1}$, more preferably lower than $10^2$ Scm$^{-1}$ and not lower than $10^{-1}$ Scm$^{-1}$. Examples of the method for adjusting the electric conductivity of the active layer include an adjusting method using oxygen deficiency, an adjusting method using a composition ratio, an adjusting method using impurities, and an adjusting method using an oxide semiconductor material, as known.

As for any other configuration about the aforementioned amorphous oxide, for example, refer to description in JP-A-2010-186860.

[Insulating Substrate]

As the insulating substrate 20, for example, a plastic film with excellent light transmittance may be used. As the plastic film, it is possible to select a film which is made of polyethylene terephthalate (PET), polyethylene naphthalate (PEN), polyether sulfone (PES), polyether imide, polyether-etherketone, polyphenylene sulfide, polycarbonate (PC), cellulose triacetate (TAC), cellulose acetate propionate (CAP), polyimide, polyarylate, bi-axially stretched polystyrene (OPS), or the like. Such a plastic film may contain an organic or inorganic filler. A flexible substrate made of, for example, aramid, and bio-nano fiber, having properties, such as flexibility, low thermal expansion, and high strength, which cannot be obtained by the existing glasses or plastics may be suitably used. Among them, polyarylate (glass transition temperature: about 193° C.), bi-axially stretched polystyrene (decomposition temperature: 250° C.), polyimide (glass transition temperature: about 300° C.), and aramid (glass transition temperature: about 315° C.), all of which have heat resistance, may be suitably used. As a result, the scintillator may be directly formed on the insulating substrate.

(Aramid)

The aramid material has high heat resistance, that is, the glass transition temperature of 315° C., high rigidity, that is, Young's modulus of 10 GPa, and high dimension stability, that is, thermal expansion rate of −3 ppm/° C. to 5 ppm/° C. For this reason, when using the film made of the aramid material, the semiconductor layer may be easily formed with high quality as compared to a case where a conventional resin film is used. Due to the high heat resistance of the aramid material, the electrode material may be cured at high temperature and have low resistance. The film of the aramid material can cope with the automatic mounting of IC including a reflow process of soldering. Since the thermal expansion coefficient of the film made of the aramid material is close to those of indium tin oxide (ITO), a gas barrier film and a glass substrate, the film made of the aramid material less warps after manufactured. The film is hardly broken. Herein, it is preferable to use a halogen-free aramid material that does not contain halogen (suitable for the regulation of JPCA-ES01-2003) in the viewpoint of reducing an environmental load. The aramid film may be stacked with a glass substrate or a PET substrate, or bonded to a case of a device.

By solving the low solubility of aramid in a solvent due to the high cohesion (hydrogen bonding strength) between molecules of the aramid using a molecular design, the aramid material may be adapted to be readily molded to a colorless, transparent and thin film and may be suitably used. By the molecular design for controlling the orderliness of monomer units, and substituent species and positions on an aromatic ring, the easiness in molding with good solubility can be achieved while maintaining a rod-shaped molecular structure with high linearity which leads to the high rigidity or dimensional stability of the aramid material. The halogen-free is realized by the molecular design.

An aramid material having optimized characteristics in an in-plane direction of a film may also be suitably used. By controlling tension conditions at each process of solution casting, vertical stretching and horizontal stretching according to the strength of the aramid film sequentially changed during the molding of the film, it is possible to balance the characteristics in the in-plane direction of the aramid film, which has a rod-shaped molecular structure and is apt to be turned to anisotropy in physical properties.

Specifically, in the solution casting process, the physical properties in an in-plane thickness direction are isotropized and the strength of the film containing the solvent, and the peeling strength from a cast and a drum are optimized by controlling the dry speed of the solvent. In the vertical stretching process, the strength of the film and the stretching conditions according to the residue of the solvent that are sequentially changed during the stretching are precisely controlled. In the horizontal stretching process, the horizontal stretching conditions according to the change in the strength of the film changed by heating and the horizontal stretching conditions for mitigating the residual stress of the film are controlled. By using the aramid material, it is possible to solve the problem that the aramid film is curled after molding.

Since only the aramid has a rod-shaped molecular structure having as high linearity as possible in either of the design for easiness in molding as described above or the design for balancing characteristics in an in-plane direction of the film, it is possible to keep the thermal expansion coefficient low. It is also possible to further reduce the thermal expansion coefficient by changing the stretching conditions at the time of fabricating the film.

(Bio-Nano Fiber)

Nano fibers may be used to reinforce of the transparent and flexible resin material since a sufficient small component as compared to light wavelength does not cause light scattering. Among the nano fibers, cellulose microfibril bundles produced by bacteria (*Acetobacter, Acetobacter Xylinum*) have a width of 50 nm and a size of about 1/10 for a visible wavelength, but have characteristics of high strength, high elasticity, and low thermal expansion. Therefore, a composite material (may be referred to as a 'bio-nano fiber') of bacteria cellulose and transparent resin may be suitably used.

It is possible to obtain a transparent bio-nano fiber exhibiting a light transmittance of about 90% at a wavelength of 500 nm while containing fiber at a high ratio of about 60 to 70% by impregnating and curing the transparent resin such as, for example, acrylic resin, and epoxy resin, in the bacteria cellulose sheet. With the bio-nano fiber, it is possible to obtain a low thermal expansion coefficient (about 3 ppm to 7 ppm) comparable to a silicon crystal, and a strength (about 460 MPa), and high elasticity (about 30 GPa) in the level a steel. For the configuration of the foregoing bio-nano fiber, for example, the disclosure of JP-A-2008-34556 may be referred to.

As described above, the present specification discloses the radiological image detection apparatus of the following (1) to (14) and the method for manufacturing the radiological image detection apparatus of the following (15) to (18) are disclosed.

(1) A radiological image detection apparatus including:
a radiological image conversion panel that includes a scintillator including a phosphor that generates fluorescence upon exposure to radiation, and a substrate supporting the scintillator;
a sensor panel that includes a pixel array disposed in close contact with the scintillator and detecting the fluorescence generated from the scintillator, and a substrate supporting the pixel array; and
a sealant that is disposed between the substrate of the radiological image conversion panel and the substrate of the sensor panel and surrounds the scintillator and the pixel array to form an isolated space on the inside of the sealant,
wherein the scintillator includes a columnar portion including a group of columnar crystals formed by growing crystals of the phosphor in columnar shapes,
a surface configured by a set of tips of the columnar crystals is disposed in close contact with the pixel array without being bonded to the pixel array, both of the substrate of the radiological image conversion panel and the substrate of the sensor panel are flexible, and
the isolated space is depressurized.

(2) The radiological image detection apparatus of the above (1), wherein
one of the substrate of the radiological image conversion panel and the substrate of the sensor panel is a first substrate disposed on an opposite side to a radiation incident side, and the other is a second substrate disposed on the radiation incident side, and
the first substrate includes a plurality of base materials stacked, the base materials including a first base material having a surface on which the scintillator or the pixel array is disposed.

(3) The radiological image detection apparatus of the above (2), wherein the sealant is disposed between another base material except for the first base material among the plurality of base materials and the second substrate.

(4) The radiological image detection apparatus of the above (3), wherein the first base material and the other base material except for the first base material among the plurality of base materials are bonded to each other with a dismantlable adhesive of which the bonding strength is reduced by energy irradiation.

(5) The radiological image detection apparatus of any one of the above (1) to (4), wherein the sealant is a dismantlable adhesive of which the bonding strength is reduced by energy irradiation.

(6) The radiological image detection apparatus of any one of the above (1) to (5), wherein each of the tips of the columnar crystals is formed in a sharply tapered shape.

(7) The radiological image detection apparatus of the above (6), wherein each of the tips of the columnar crystals has an apex angle of 40° to 80°.

(8) The radiological image detection apparatus of the above (6) or (7), wherein a filler is filled between the tips of the columnar crystals.

(9) The radiological image detection apparatus of the above (8), wherein the scintillator is coated with a moisture-proof protective film, and
the refractive index of the filler is smaller than that of the protective film.

(10) The radiological image detection apparatus of the above (8) or (9), wherein the filler is at least one selected from the group consisting of phenol resin, urea resin, melamine resin, unsaturated polyester resin, epoxy resin, and diallyl phthalate resin.

(11) The radiological image detection apparatus of any one of the above (1) to (10), wherein each of the substrate of the radiological image conversion panel and the substrate of the sensor panel is a flexible glass substrate.

(12) The radiological image detection apparatus of any one of the above (1) to (11), wherein each pixel of the pixel array is configured to include an organic photoelectric conversion element that includes a photoconductive layer of an organic photoelectric conversion film.

(13) The radiological image detection apparatus of any one of the above (1) to (12), wherein the substrate of the radiological image conversion panel is a first substrate disposed on an opposite side to a radiation incident side, and the substrate of the sensor panel is a second substrate disposed on the radiation incident side.

(14) The radiological image detection apparatus of the above (2), wherein the substrate of the radiological image conversion panel is the first substrate disposed on an opposite side to a radiation incident side, the substrate of the sensor panel is the second substrate disposed on the radiation incident side, and the scintillator is disposed on the surface of the first base material.

(15) A method for manufacturing the radiological image detection apparatus of the above (1), including:
overlapping the radiological image conversion panel and the sensor panel while the scintillator and the pixel array face to each other and the sealant is provided between the substrate of the radiological image conversion panel and the substrate of the sensor panel which are to be bonded; and
depressurizing by the sealant the isolated space formed between the substrate of the radiological image conversion panel and the substrate of the sensor panel to make the scintillator and the pixel array come into close contact with each other without being bonded to each other.

(16) A method for manufacturing the radiological image detection apparatus of the above (1), wherein one of the substrate of the radiological image conversion panel and the substrate of the sensor panel is a first substrate disposed on an opposite side to a radiation incident side, and the other is a second substrate disposed on the radiation incident side, and
the first substrate includes a plurality of base materials stacked, the base materials including a first base material having a surface on which the scintillator or the pixel array is disposed,
the method including:
overlapping the first base material with the second substrate while the scintillator and the pixel array face to each other;
overlapping another base material except for the first base material among the plurality of base materials with the first base material and the second substrate while an adhesive is provided between the first base material and the other base material and the sealant is provided between the other base material and the second substrate; and
depressurizing by the sealant the isolated space formed between the other base material and the second substrate to make the scintillator and the pixel array come into close contact with each other without being bonded to each other.

(17) The method of the above (1), wherein the adhesive is a dismantlable adhesive of which the bonding strength is reduced by energy irradiation.

(18) The method of any one of the above (15) to (17), wherein the sealant is a dismantlable adhesive of which the bonding strength is reduced by energy irradiation.

What is claimed is:
1. A radiological image detection apparatus comprising:
a radiological image conversion panel that includes a scintillator including a phosphor that generates fluorescence upon exposure to radiation, and a substrate supporting the scintillator;
a sensor panel that includes a pixel array disposed in close contact with the scintillator and detecting the fluorescence generated from the scintillator, and a substrate supporting the pixel array; and
a sealant that is disposed between the substrate of the radiological image conversion panel and the substrate of the sensor panel and surrounds the scintillator and the pixel array to form an isolated space on the inside of the sealant,
wherein the scintillator includes a columnar portion including a group of columnar crystals formed by growing crystals of the phosphor in columnar shapes,
a surface configured by a set of tips of the columnar crystals is disposed in close contact with the pixel array without being bonded to the pixel array, both of the substrate of the radiological image conversion panel and the substrate of the sensor panel are flexible, the isolated space is depressurized, the substrate of the radiological image conversion panel is a first substrate disposed on an opposite side to a radiation incident side, the first substrate includes a plurality of base materials stacked, the base materials including a first base material having a surface on which the scintillator is disposed, and the first base material and another base material except for the first base material among the plurality of base materials are bonded to each other with a dismantlable adhesive of which the bonding strength is reduced by energy irradiation.

2. The radiological image detection apparatus of claim 1, wherein the substrate of the sensor panel is a second substrate, and the sealant is disposed between another base material except for the first base material among the plurality of base materials and the second substrate.

3. The radiological image detection apparatus of claim 1, wherein the sealant is a dismantlable adhesive of which the bonding strength is reduced by energy irradiation.

4. The radiological image detection apparatus of claim 1, wherein each of the tips of the columnar crystals is formed in a sharply tapered shape.

5. The radiological image detection apparatus of claim 4, wherein each of the tips of the columnar crystals has an apex angle of 40° to 80°.

6. The radiological image detection apparatus of claim 4, wherein a filler is filled between the tips of the columnar crystals.

7. The radiological image detection apparatus of claim 6, wherein the scintillator is coated with a moisture-proof protective film, and the refractive index of the filler is smaller than that of the protective film.

8. The radiological image detection apparatus of claim 6, wherein the filler is at least one selected from the group consisting of phenol resin, urea resin, melamine resin, unsaturated polyester resin, epoxy resin, and diallyl phthalate resin.

9. The radiological image detection apparatus of claim 1, wherein each of the substrate of the radiological image conversion panel and the substrate of the sensor panel is a flexible glass substrate.

10. The radiological image detection apparatus of claim 1, wherein each pixel of the pixel array is configured to include an organic photoelectric conversion element that includes a photoconductive layer of an organic photoelectric conversion film.

11. The radiological image detection apparatus of claim 1, wherein the substrate of the radiological image conversion panel is a first substrate disposed on an opposite side to a radiation incident side, and the substrate of the sensor panel is a second substrate disposed on the radiation incident side.

12. The radiological image detection apparatus of claim 1, wherein the substrate of the sensor panel is a second substrate disposed on the radiation incident side, and the scintillator is disposed on the surface of the first base material.

* * * * *